United States Patent

Lee

[11] 4,371,842
[45] Feb. 1, 1983

[54] SELF-ADJUSTING DUAL MODE AUTOMATIC GAIN CONTROL CIRCUIT

[75] Inventor: Patrick S. Lee, Campbell, Calif.

[73] Assignee: Sperry Corporation, New York, N.Y.

[21] Appl. No.: 200,364

[22] Filed: Oct. 24, 1980

[51] Int. Cl.³ .............................................. H03G 3/30
[52] U.S. Cl. ..................................... 330/141; 330/281
[58] Field of Search ............... 330/110, 138, 141, 280, 330/281; 455/242, 244; 375/98

[56] References Cited

U.S. PATENT DOCUMENTS

| | | | |
|---|---|---|---|
| 3,032,719 | 5/1962 | Beck | 330/281 |
| 3,620,631 | 11/1971 | Stopka et al. | 330/281 X |
| 4,292,598 | 9/1981 | Yasumura | 330/281 |

*Primary Examiner*—James B. Mullins
*Attorney, Agent, or Firm*—Eugene T. Battjer

[57] ABSTRACT

An automatic gain control circuit comprising a gain-controlled amplifier for receiving a variable amplitude, pulse-type input signal to produce a substantially constant amplitude, pulse-type output signal which is applied to a feedback circuit for comparison with a predetermined reference voltage to generate a control voltage to set the gain of the amplifier. A voltage limiter included in the feedback circuit clips the pulse peaks of the output signal whenever the peaks exceed a predetermined amplitude so that the gain of the amplifier is reduced in a prescribed manner to preclude output signal dropout. A peak detector and a filter included in the feedback circuit are capable of operating in fast and slow modes. When operating in the fast mode, the peak detector responds essentially to each pulse peak of the output signal and the filter has a wide bandwidth so that the automatic gain control circuit operates with a prescribed fast time response. When operating in the slow mode, the peak detector operates to increase the gain of the amplifier slowly in order to limit output signal overshoot and preclude output signal dropout if the input signal reappears after an absence for some period. The filter, when operating in the slow mode, has a narrow bandwidth so that the automatic gain control circuit operates with a time response substantially slower than the fast time response. A controller circuit produces, in response to the output signal, a controller signal which causes fast mode operation of the peak detector and filter whenever the output signal is present and slow mode operation thereof whenever the output signal is absent for a predetermined time period.

7 Claims, 10 Drawing Figures

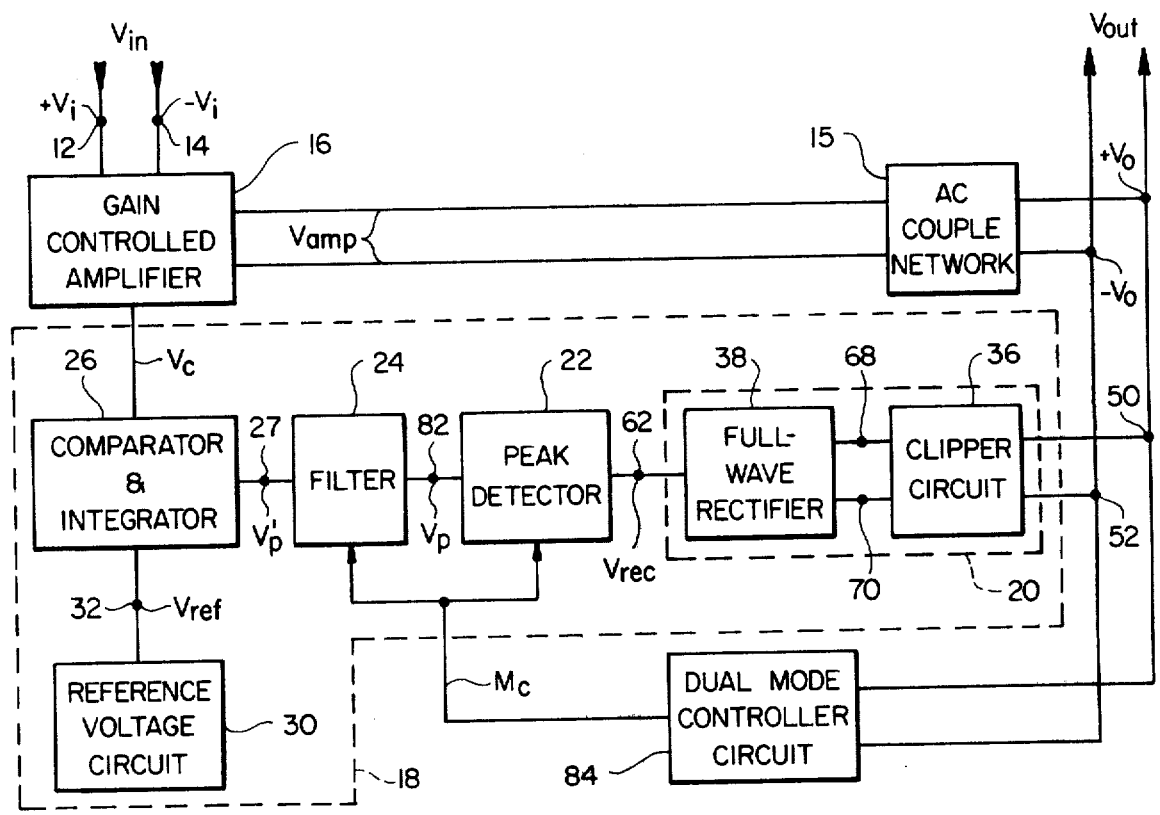
FIG_1
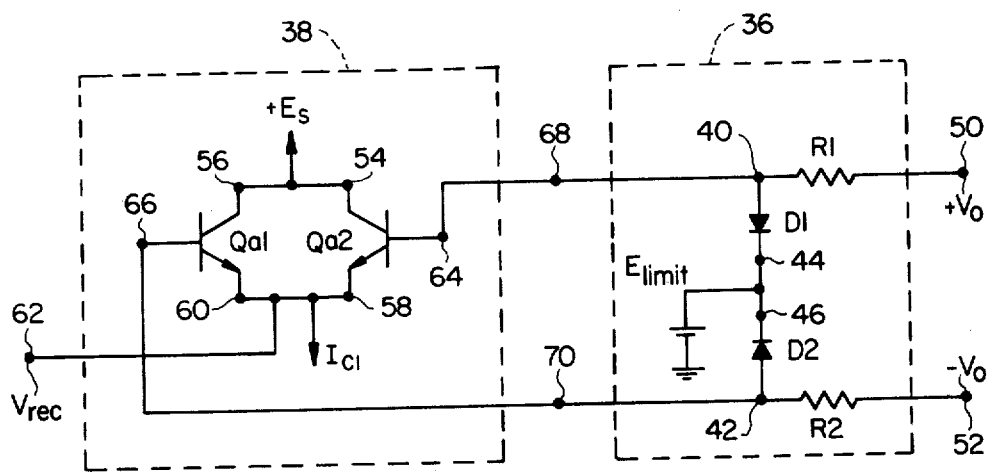
FIG_2

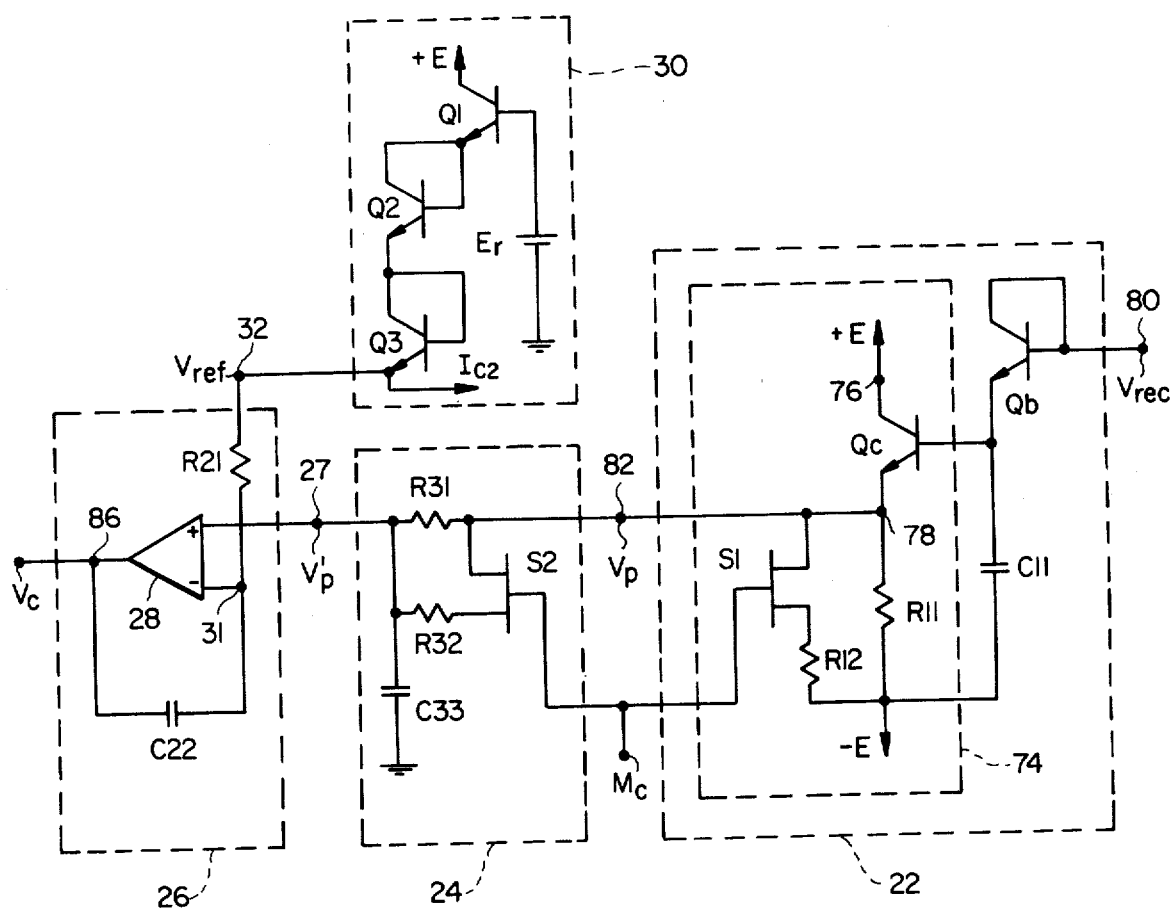
FIG_3
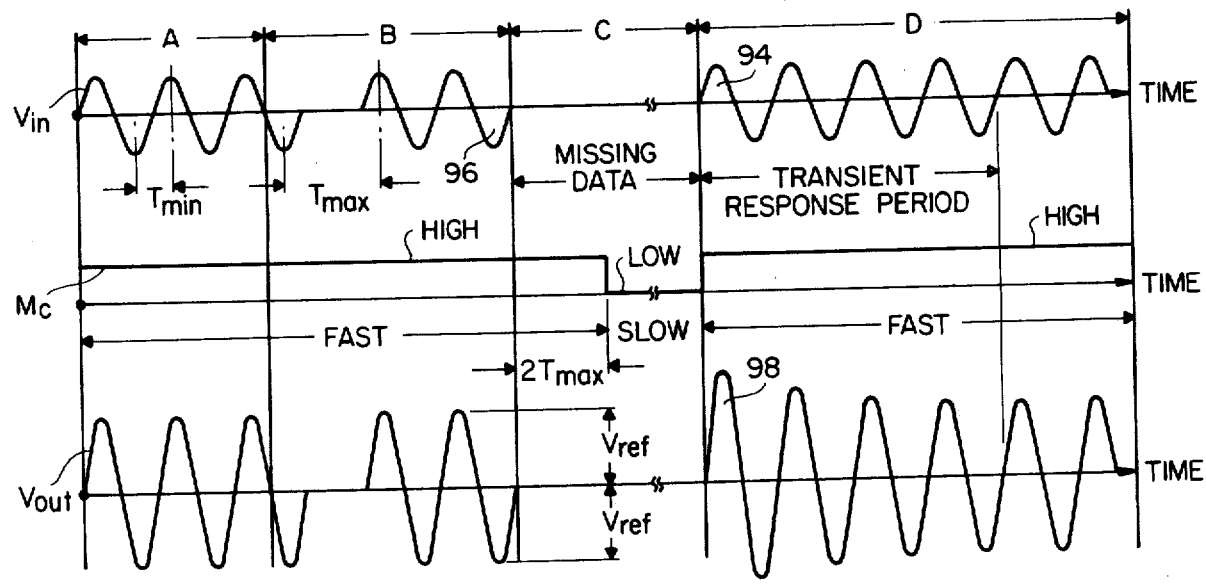
FIG_4

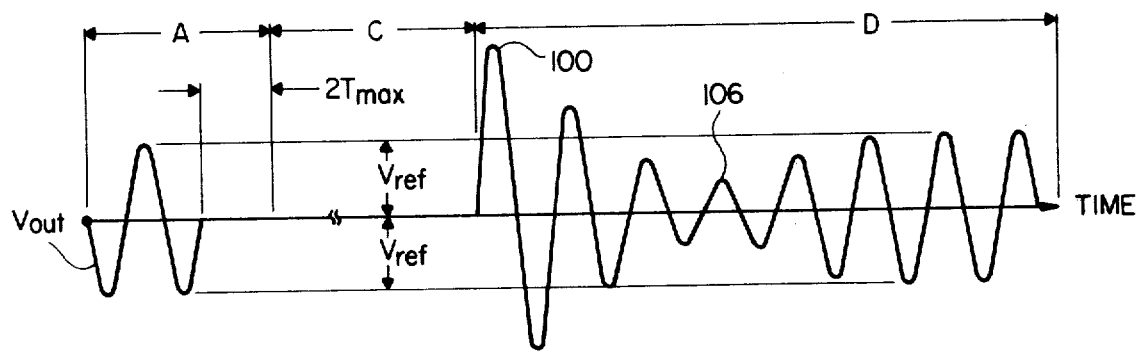
*FIG__5A*
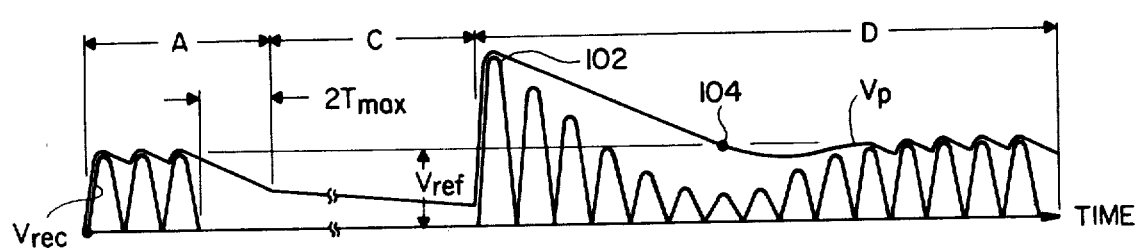
*FIG__5B*
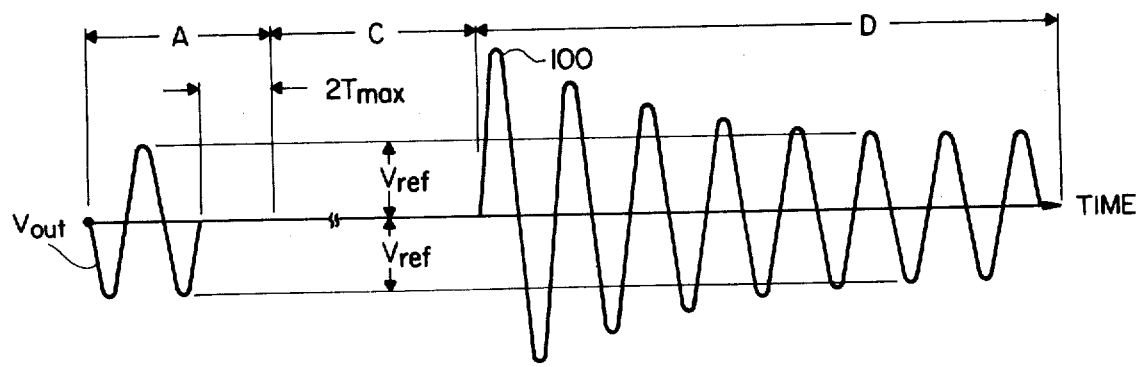
*FIG__6A*
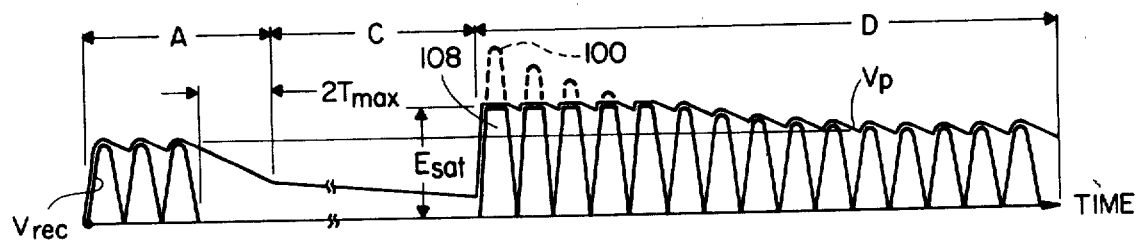
*FIG__6B*

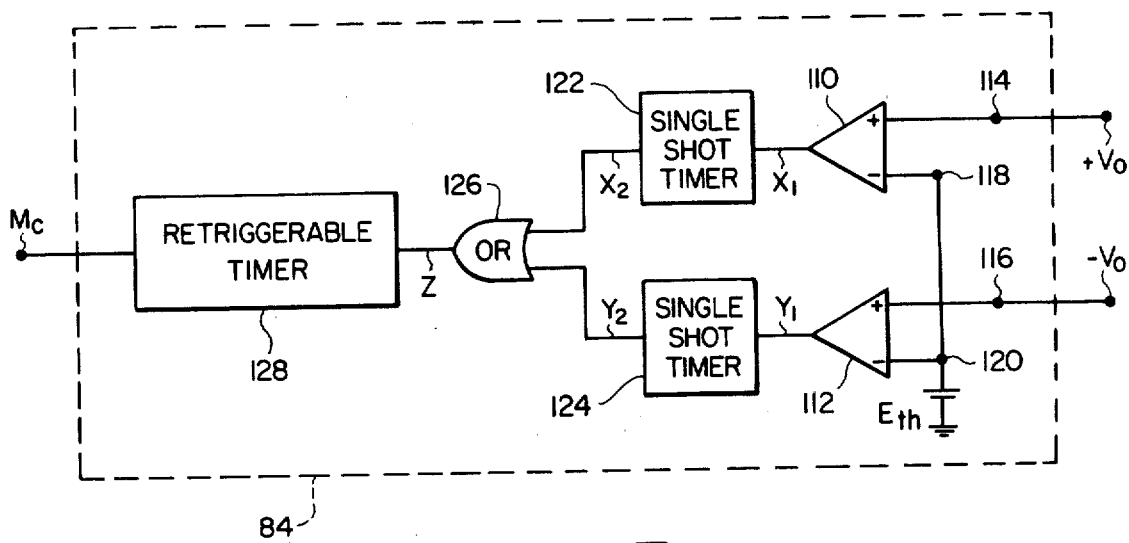
FIG_7
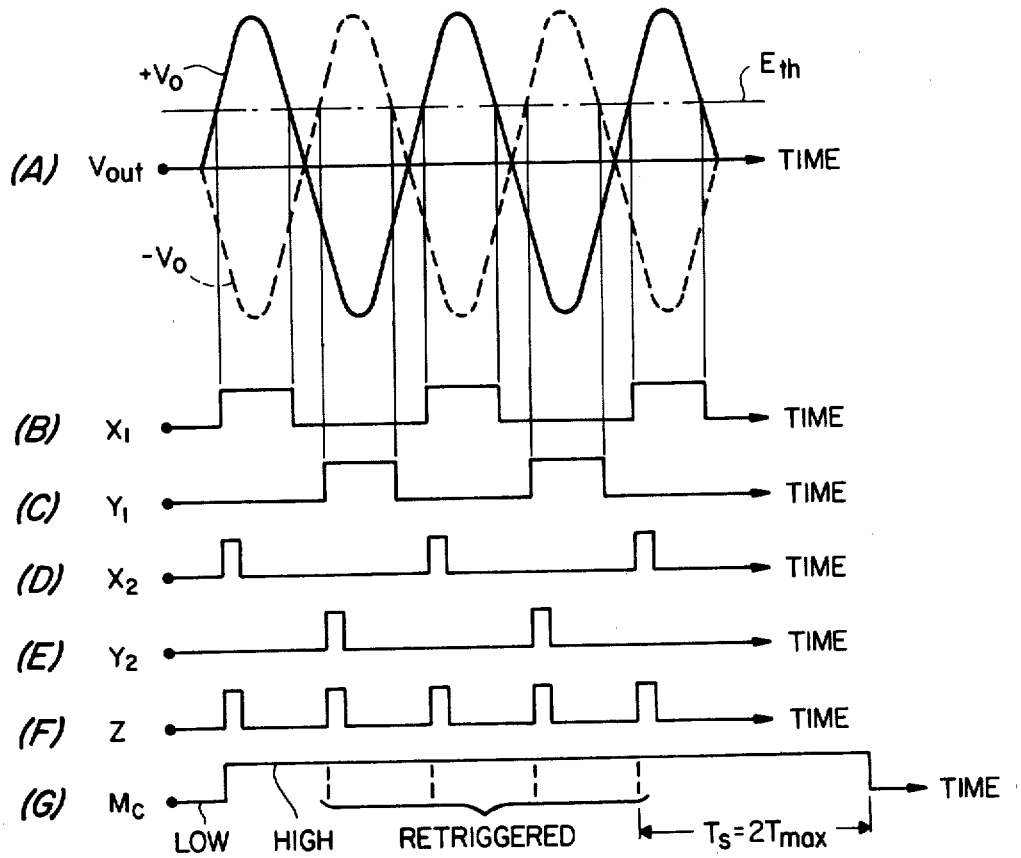
FIG_8

SELF-ADJUSTING DUAL MODE AUTOMATIC GAIN CONTROL CIRCUIT

BACKGROUND OF THE INVENTION

1. Field of the Invention

This invention relates to automatic gain control circuits and more specifically to improvements in such circuits particularly suited to the reception of pulse type signals, for instance, in digital magnetic recording readback systems.

2. Description of the Prior Art

An automatic gain control circuit typically comprises a gain-controlled amplifier for receiving a variable amplitude input signal to produce a substantially constant amplitude output signal which is applied to a feedback circuit. The feedback circuit includes a peak detector that produces a feedback voltage for comparison with a reference voltage to generate a control voltage for setting the gain of the gain-controlled amplifier so that the magnitude of the output signal is held substantially equal to a desired amplitude. The peak detector includes a capacitor circuit which operates with a charging rate which permits the peak detector to follow closely the peak amplitudes of the output signal. The discharging rate of the capacitor circuit is made slower than the changing rate so that the capacitor does not fully discharge between successive peaks of the input signal, thus enhancing the ability of the peak detector to follow the peaks of the output signal. A readback circuit is usually coupled to the output of the automatic gain control circuit and operates to detect data which is represented by the locations of the peaks in the output signal.

While such a circuit has been used with success in analog-signal detection systems, certain limitations occur in the ease of pulse type signal detection systems wherein the input signal may be expected to be absent during certain periods. In a disk drive system, for example, wherein data is recorded on a plurality of concentric tracks on a recording disk, the data is arranged along each track such that segments, known as address marks, occur which contain no data. Furthermore, portions of the disk surface may have imperfections which will result in the data recorded on those portions having such low amplitudes that the data cannot be detected by the readback circuit. Such loss of data is known in the disk drive art as data drop-out. In any case such as address mark or data drop-out where the input signal is absent for some period, the gain of the gain-controlled amplifier will be substantially higher than a nominal gain level because the automatic gain control circuit attempts to increase the amplitude of the output signal from essentially zero to the desired amplitude by raising the gain quickly to a large value. Upon the reappearance of the input signal at a nominal peak amplitude, the automatic gain control circuit will produce an output signal which is substantially greater in amplitude than that which would be produced if the gain were at the nominal gain level. The capacitor circuit of the peak detector charges rapidly in response to the abrupt increase in the output signal voltage. A large amplitude feedback voltage is thus produced which results in the gain of the gain-controlled amplifier to be reduced at a rapid rate in an effort by the automatic gain control circuit to restore the output signal voltage to the desired amplitude. However, the capacitor circuit of the peak detector cannot respond as fast as the reduction in the output signal voltage because as explained above, the discharge rate is slow. As a result, the amplitude of the feedback voltage produced by the peak detector will not closely follow the amplitude of the output signal. Therefore, the gain reduction of the gain-controlled amplifier will not be suitably controlled and the amplitude of the output signal is likely to fall below (that is, undershoot) the desired amplitude before the peak detector is able to produce the proper feedback voltage to stop the gain reduction. Undershooting is undesirable because some data will be lost if the output signal peaks are reduced to a level too low to be detected by the readback circuitry coupled to receive the output signal. Such data loss is known as output signal dropout.

SUMMARY OF THE INVENTION

The above mentioned limitation of presently available automatic gain control circuits is overcome by the provision of a new and improved automatic gain control circuit particularly suited to pulse type signal detection wherein the signal may be expected to drop out from time to time. The new and improved circuit includes a gain-controlled amplifier which operates in conventional manner for receiving a variable-amplitude, pulse-type input signal to produce a substantially constant amplitude, pulse-type output signal. The feedback circuit of the automatic gain control circuit includes a peak detector having a capacitor circuit which generates a feedback voltage that is applied to a comparator and integrator circuit. The comparator and integrator circuit operates to compare the feedback voltage with the reference voltage so as to produce a control voltage for setting the gain of the gain-controlled amplifier. A voltage limiter included in the feedback circuit to receive the output signal for application to the peak detector operates to clip the peaks of the output signal whenever the peaks exceed a predetermined amplitude so that in a case where the input signal reappears after some period of absence, the gain of gain-controlled amplifier is reduced in a prescribed manner to preclude the aforementioned undershoot problem and resultant output signal dropout. More specifically, the output signal is clipped prior to being applied to the peak detector such that the control voltage output of the comparator and integrator circuit does not cause the gain of the gain-controlled amplifier to decrease at a rate which reduces the output voltage faster than the discharge rate of the capacitor circuit.

Another feature of the automatic gain control circuit made in accordance with the teachings of the present invention is the provision of a dual mode peak detector having a capacitor circuit with fast and slow discharge rates so that the peak detector is capable of operating in fast and slow modes. In a case where the input signal is present, the peak detector will operate in the fast mode with the capacitor circuit operating at the fast discharge rate thereby permitting the peak detector to detect essentially each peak of the signal from the voltage limiter as the output signal amplitude is being reduced. In the case where the input signal is absent for at least a predetermined period, the peak detector will operate in the slow mode wherein the capacitor circuit operates at the slow discharge rate, which is substantially slower than the fast discharge rate. The slow discharge rate results in a slower reduction of the feedback voltage. Therefore, the gain of the gain-controlled amplifier will be increased at a prescribed rate slower than the rate which would result if the peak detector operated only in a fast mode. Accordingly, if the input signal reappears with essentially the same magnitude as that prior to signal disappearance the amplitude of the output is likely not to overshoot substantially the desired level for the output signal so the need for voltage limiting, as explained above, may not be needed and further assurance of precluding signal dropout is obtained.

Fast and slow mode operation of the peak detector is controlled by a dual mode controller circuit which is coupled in parallel with the feedback circuit. The controller circuit compares the amplitude of each pulse of the output signal with a threshold voltage to produce a controlled signal pulse, of fixed time duration, when the output signal pulse initially exceeds the threshold voltage. The controller signal pulse is used to maintain the peak detector in the fast mode. On the other hand, if the output signal pulse is less than the threshold voltage, corresponding to the situation in which the input signal is absent, no controller signal pulse is produced so that the peak detector operates in the slow mode.

It should be noted that if the input signal was absent for a prolonged period so that the capacitor circuit became fully discharged and the gain of the gain-controlled amplifier was at maximum level, the dual mode feature of the peak detector would no longer have an effect to preclude the problem of output signal dropout which is likely to occur upon the reappearance of the input signal. Clipping means, however, such as the aforementioned voltage limiter, is useful to prevent output signal dropout but has a disadvantage in that the actual output signal produced upon the reappearance of the input signal, which was previously absent for some period, is likely to be amplified to a level substantially larger than a desired amplitude for the output signal for a longer time than if the voltage limiter was not included. The substantially large output signal peaks may saturate some of the amplifiers used in the data processing circuitry coupled to the automatic gain control circuit. Such saturation decreases the reliability of detecting the data because of increased uncertainty in locating the pulse peaks representative of the data. However, if the input signal reappears before the capacitor circuit has been substantially discharged, the magnitude of the subsequently produced output signal is likely not to overshoot substantially the desired amplitude because the gain had not been increased to maximum value. As a result, the peak detector in the present invention is more reliable than the voltage limiter for precluding output signal dropout without saturating some amplifiers of the data processing circuitry.

A further feature of the present invention is the provision of a dual mode filter in the feedback circuit. The filter is coupled to the output of the peak detector and is also capable of operating in fast and slow modes. When operating in the fast mode, the filter has a wide bandwidth so that the automatic gain control circuit operates with a prescribed time response. When operating in the slow mode, the filter has a narrow bandwidth so that the automatic gain control circuit operates with a time response substantially slower than the prescribed time response. Moreover, slow mode operation of the filter also reduces the sensitivity of the automatic gain control circuit to spurious noise pulses by blocking some noise pulses and slowing the response of the automatic gain control circuit to other noise pulses. Dual mode operation of the filter is controlled by the dual mode controller circuit in the same manner as previously described for the peak detector.

The above described and other features of the invention will be more fully understood from a reading of the ensuing detailed description of the preferred embodiment given with reference to the appended drawings.

BRIEF DESCRIPTION OF THE DRAWINGS

FIG. 1 is a block diagram of a preferred embodiment of an automatic gain control circuit incorporating the principles of the present invention.

FIG. 2 is an electrical schematic of the voltage limiter incorporated in FIG. 1.

FIG. 3 is an electrical schematic of the peak detector, filter, comparator and integrator incorporated in FIG. 1.

FIG. 4 depicts waveforms which are useful for explaining the understanding dual mode operation of the present invention.

FIG. 5A and 5B depict waveforms which are useful for explaining and understanding the operation and advantages of the preferred embodiment of the present invention.

FIGS. 6A and 6B depict waveforms which are useful for explaining and understanding the operation and advantages of the voltage limiter incorporated in the preferred embodiment of the present invention.

FIG. 7 is an electrical schematic of the dual mode controller incorporated in FIG. 1.

FIG. 8 depicts waveforms which are useful for explaining and understanding the operation of the dual mode controller circuit illustrated in FIG. 7.

DESCRIPTION OF THE PREFERRED EMBODIMENT

Depicted in FIG. 1 is a block diagram of an automatic gain control circuit 10 incorporating the principles of the present invention. Input signal $V_{in}$ is applied to input terminals 12 and 14 of gain-controlled amplifier 16. Signal $V_{in}$ is a pulse type signal having variable positive and negative amplitude peaks that arise, for example, in a disk drive system from a signal produced by a transducer detecting magnetic transitions representative of data recorded on a disk. Signal $V_{in}$ is preferably dual ended; that is, the signal designated as $+V_i$ applied to terminal 12 is the mirror image of the signal designated as $-V_i$ applied to terminal 14. Gain-controlled amplifier 16 is well known in the art and operates in conventional matter to amplify signal $V_{in}$ so as to produce a substantially constant amplitude, pulse-type amplified signal $V_{amp}$. AC (alternating current) couple network 15 is coupled to receive signal $V_{amp}$ in order to produce output signal $V_{out}$ and operates in a known matter to remove any DC (direct current) bias that may exist in amplified signal $V_{amp}$ due to gain-controlled amplifier 16 or contained in signal $V_{in}$. Therefore, if a time-amplitude plot of signal $V_{out}$ is made, the pulses of signal $V_{out}$ will be disposed about a zero-amplitude base line. Feedback circuit 18 coupled to receive output signal $V_{out}$ includes voltage limiter 20 cascaded to peak detector 22 which is connected to filter 24. Circuit 18 further includes comparator and integrator 26 coupled to the output of filter 24. Feedback signal $V'_p$ is applied to a first input terminal 27 of comparator and integrator 26 that has reference voltage circuit 30 applied to a second input terminal 32. Reference circuit 30 will be discussed in greater detail in connection with FIG. 3. Control signal $V_c$ produced by comparator and integrator 26 is used to set the gain of gain-controlled amplifier 16 which is coupled to the output of comparator and integrator 26.

FIG. 2 is an electrical schematic of the voltage limiter 20 incorporated in FIG. 1. The voltage limiter includes clipper circuit 36 and full wave rectifier output stage 38. Clipper circuit 36 includes resistors $R_1$ and $R_2$ each connected to the anode terminals 40 and 42 of diodes $D_1$ and $D_2$ respectively. Cathode terminals 44 and 46 are tied in common with one terminal of voltage source $E_{limit}$ which has its other terminal connected to ground. In the conduction mode, each diode has a small potential drop $V_d$ from anode to cathode. Diode $D_1$ or $D_2$ operates in the conduction mode whenever the voltage applied to anode 40 or 42, respectively, exceeds a positive saturation voltage $E_{sat}$ which is equal to the sum of $V_d$ and $E_{limit}$. Accordingly, in the case where signal $V_{out}$ applied to input terminal 50 or 52 is a positive pulse with a peak amplitude equaling or exceeding $E_{sat}$, clipper circuit 36 operates to clip such pulse so that the signal applied to the input of rectifier 38 has a maximum amplitude equal to $E_{sat}$. In the case where signal $V_{out}$ applied to terminal 50 or 52 is a negative pulse or a positive pulse having a peak amplitude less than $E_{sat}$, clipper circuit 36 will pass such pulse unchanged to the input of rectifier output stage 38.

Full wave rectifier output stage 38 includes two matched transistors $Q_{a1}$ and $Q_{a2}$, preferably npn type transistors arranged such that collector terminals 54 and 56 are connected in common to a positive voltage $+E_s$, emitter terminals 58 and 60 are coupled to output terminal 62 and constant current source $I_{c1}$, and base terminals 64 and 66 are coupled respectively to output leads 68 and 70 of clipper circuit 36. Rectifier 38 is well known in the art and operates in conventional manner like a positive absolute magnitude circuit so as to produce signal $V_{rec}$ by passing only the pulses received from clipper circuit 36 which has positive amplitudes and to block the pulses having negative amplitudes.

FIG. 3 is an electrical schematic of peak detector 22, filter 24, reference voltage circuit 30, comparator and integrator 26 incorporated in FIG. 1. Peak detector 22 includes transistor $Q_b$, preferably npn type, coupled to capacitor $C_{11}$. Emitter follower circuit 74 is connected in parallel to capacitor C11 and includes transistor $Q_c$, preferably npn type having collector lead 76 coupled to positive voltage $+E$ and emitter lead 78 coupled to resistor $R_{11}$. Connected in parallel with resistor $R_{11}$ is a circuit including field effect transistor $S_1$ and resistor $R_{12}$. Capacitor $C_{11}$ and resistors $R_{11}$ and $R_{12}$ are also coupled to negative voltage $-E$. Transistor $Q_b$ functions like a diode which is forward biased when a pulse of signal $V_{rec}$, applied to base lead 80, rises to a peak amplitude level to charge up $C_{11}$ and reverse biased when the pulse of signal $V_{rec}$ decreases in amplitude from its peak level. The charging time constant $T_{ch}$ of peak detector 22 is equal to $R_d C_{11}$, where $R_d$ is the small diode resistance of transistor $Q_b$. Emitter follower circuit 74 provides two paths for discharging capacitor $C_{11}$ so that peak detector 22 is capable of operating in fast and slow modes. When peak detector 22 operates in slow mode, field effect transistor $S_1$ is non-conducting so that the expression for the time constant for discharging capacitor $C_{11}$ is:

$$T_{disch}(\text{slow}) = \beta R_{11} C_{11}$$

where $\beta$ is the current amplification factor of transistor $Q_c$. When peak detector 22 operates in fast mode, field effect transistor $S_1$ is conducting so that the expression for the time constant for discharging capacitor $C_{11}$ is:

$$T_{disch}(\text{fast}) = C_{11} \beta R_{11} R_{12}/(R_{11}+R_{12})$$

where $R_{11}$ is much greater in resistance than $R_{12}$. In either mode of operation, peak detector 22 is arranged such that the magnitude of the time constant for discharging capacitor $C_{11}$ is larger than the magnitude of the charging time constant $T_{ch}$ for charging capacitor $C_{11}$. As a result, the discharge rate for capacitor $C_{11}$ is slower than its charging rate.

Low-pass filter 24 coupled to output lead 82 of peak detector 22 is also capable of operating in fast and slow modes. Filter 24 operates in the fast mode whenever field effect transistor $S_2$ is conducting so that resistor $R_{32}$ is connected in parallel to resistor $R_{31}$. Filter 24 is a first order filter operating with two time constants $T_f$ (slow) and $T_f$ (fast) which correspond respectively to the slow and fast mode operations of the filter. The values of the two filter time constants are determined from the following expressions:

$$T_f(\text{slow}) = R_{31} C_{33}$$

$$T_f(\text{fast}) = C_{33} R_{31} R_{32}/(R_{31}+R_{32})$$

where $R_{31}$ is greater in resistance than $R_{32}$.

Field effect transistors $S_1$ and $S_2$ are controlled by control signal $M_c$ produced by dual mode controller circuit 84 (not shown in FIG. 3). Controller circuit 84 will be explained in greater detail in hereinafter with reference to FIGS. 7 and 8. Signal $M_c$ has either one of two amplitudes; that is, low level which is insufficient to trigger $S_1$ and $S_2$ to become conducting or high level which will cause $S_1$ and $S_2$ to become conducting.

Signal $V'_p$ is produced at the output of filter 24 in response to signal $V_p$ applied to the filter input. Signal $V'_p$ is applied to first input terminal 27 of comparator and integrator 26 which includes an operational amplifier 28 that functions in conventional manner as a differencer when a reference voltage from reference voltage circuit 30 is applied via resistor $R_{21}$ to second input terminal 31 (designated as the minus terminal of the operational amplifier). Reference voltage $V_{ref}$ is derived from reference voltage circuit 30 which includes constant current source $I_{c2}$, voltage sources $E_r$ and $+E$ and three transistors Q1, Q2, and Q3 all preferably npn type. Since signal $V'_p$ produced in response to signal $V_{out}$ has been decreased in voltage level by the passage through three transistors $Q_{a1}$ or $Q_{a2}$, $Q_b$ and $Q_c$, voltage source $E_r$ is also processed through three transistors Q1, Q2, and Q3, in an effort to produce reference voltage $V_{ref}$ with the same voltage drop as that for signal $V'_p$ relative to signal $V_{out}$. Accordingly, all the above mentioned transistors must be matched with one another so as to have substantially the same voltage drops when they are conducting.

The circuit configuration of comparator and integrator 26 is well known in the art, and operates with a time constant $T_i$ equal to the product of $R_{21}$ and $R_{22}$. Time constants $T_f$(slow), $T_f$(fast) and $T_i$ are chosen so as to result in a prescribed transient time response for automatic gain control circuit 10. The relations between dual time constants $T_f$(slow) and $T_f$(fast) for filter 24 and $T_i$ are as follows:

$$T_f(\text{fast}) = nT_i$$

where n is a fixed constant such as three, and $$T_f(\text{slow}) = qT_f(\text{fast}) = qnT_i$$

where q is a fixed constant such as six. Control signal $V_c$ produced at the output of comparator and integrator 26 sets the gain of gain-controlled amplifier 16 so that the amplitude of the output signal is equal to the desired amplitude of $V_{ref}$.

With reference to FIG. 4, the advantages of dual mode operation of the present invention will now be discussed. Four situations designated as A-D above input signal $V_{in}$ are depicted relative to control signal $M_c$ and output signal $V_{out}$. The illustrated situations typically arise during the operation of a disk drive system and are used only for purposes of explaining the operation of the invention. It should be noted that signals $V_{in}$, $M_c$ and $V_{out}$ are shown in situation coincidence and are not in time coincidence with one another. In the situation designated as A, signal $V_{in}$ has alternating positive and negative going peaks separated by a time interval $T_{min}$ which is the minimum time interval expected between pulse peaks for the illustrative disk drive system. When signal $V_{in}$ is present, automatic gain control circuit 10 operates in fast mode so that control signal $M_c$ has an amplitude at its high level which permits field effect transistors $S_1$ and $S_2$ (shown in FIG. 3) to become conducting so that peak detector 22 and filter 24 both operate in the fast mode. Accordingly, signal $V_{out}$ is produced with peaks substantially equal to the reference voltage level $V_{ref}$.

In the situation designated by B, signal $V_{in}$ has pulse peaks separated by $T_{max}$ which is the maximum time interval expected between pulses in the illustrative disk drive system. Control signal $M_c$ is still at a high level corresponding to fast mode operation because input signal $V_{in}$ is present, so that automatic gain control circuit 10 produces output signal $V_{out}$ with peaks substantially equal to reference voltage $V_{ref}$.

In the situation designated as C, signal $V_{in}$ has no data pulses. Without the dual mode feature of the peak detector 22, the absence of signal $V_{in}$ would cause the gain of gain-controlled amplifier 16 to be increased at a fast rate because the essentially zero amplitude for signal $V_{out}$ will result in maximum amplitude for control signal $V_c$. In such case, spurious noise pulses will be greatly amplified and possibly erroneously detected as data by subsequent data processing circuitry coupled to automatic gain control circuit 10. In the preferred embodiment of the present invention, however, peak detector 22 switches to the slow mode in such case where signal $V_{in}$ is absent for a prescribed period of time, preferably equal to twice $T_{max}$. During slow mode operation, capacitor $C_{11}$ of peak detector 22 discharges with time constant $T_{disch}$ (slow) which is substantially greater than $T_{disch}$ (fast) so that signal $V_p$ produced in feedback circuit 18 will decrease in amplitude at the same rate as the discharging rate corresponding to $T_{disch}$ (slow) for capacitor $C_{11}$. As a result, the gain of gain-controlled amplifier 16 will increase only at a prescribed rate corresponding to slow mode operation of peak detector 22, and not at the fast rate.

In situations A and B described above, filter 24 also operates in the fast mode. Automatic gain control circuit 10 is designed such that the bandwidth of filter 24 affects the transient time response of automatic gain control circuit 10 to the pulses of signal $V_{out}$. In the fast mode, filter 24 operates with a wide bandwidth (wide in comparison with the narrow bandwidth corresponding to slow mode operation) so that automatic gain control circuit 10 responds very rapidly to any change in input signal $V_{in}$ and yields output signal $V_{out}$ with prescribed performance parameters such as transient response time, overshoot level, steady state error, and stability which are all well known in the art.

In situation C where signal $V_{in}$ and $V_{out}$ have been absent for the prescribed period, filter 24 switches to the slow mode where the bandwidth is substantially narrower than that for fast mode operation. In such case, the transient response time of automatic gain control circuit 10 is substantially slower than that for fast mode so as to correspond to slow mode operation of peak detector 22 wherein signal $V_p$ is changing at a slow rate because peak detector 22 is operating with time constant $T_{disch}$ (slow). Furthermore, reducing the bandwidth of filter 24 will also reduce the noise present in signal $V'_p$ so that automatic gain control circuit 10 has reduced sensitivity to spurious noise pulses during slow mode operation of peak detector 22 and filter 24.

In situation D, signal $V_{in}$ reappears after the absence period. In such case, signal $M_c$ switches to a high level so that peak detector 22 and filter 24 revert to the fast mode of operation. If signal $V_{in}$ reappears with initial pulse 94 having a peak magnitude essentially equal to the peak magnitude of pulse 96, which is the last pulse received prior to the disappearance of signal $V_{in}$, initial pulse 98 of signal $V_{out}$ will have a peak magnitude larger than the desired $V_{ref}$ level for $V_{out}$ because the gain of gain control amplifier 16 has been increased during the period of signal absence. As can be seen in FIG. 4, automatic gain control circuit 10 subsequently responds to the initially large pulse 98 of signal $V_{out}$ by reducing the gain so that the peak amplitudes of signal $V_{out}$ thereafter decrease in magnitude until the desired $V_{ref}$ level is achieved.

It should be noted that a smooth reduction of the peak amplitudes of signal $V_{out}$ from the initially large overshoot level to the desired $V_{ref}$ level occurs only if the rate of gain reduction is not greater than the prescribed fast mode discharge rate of capacitor $C_{11}$. As further explanations, reference is made to FIGS. 5A and 5B which depict time-amplitude plots of waveforms produced by various portions of automatic gain control circuit 10 in response to three situations, A, C, and D, which are the same as the A, C, and D, situations previously described for FIG. 4. Moreover, as was the case for FIG. 4, the parallel lines of waveshapes shown in FIGS. 5A and 5B are not in time coincidence with one another but only in situation coincidence. In situation A of FIGS. 5A and 5B, signal $V_{out}$ is produced in response to signal $V_{in}$ (not shown) and signal $V_p$ produced by peak detector 22 has peaks essentially matching that of rectifier signal $V_{rec}$ produced by voltage limiter 20. It should be understood that the waveshape after the peak of each pulse of signal $V_p$ is not the same as that for signal $V_{rec}$ because the magnitude of the discharge rate of peak detector 22 is less than the magnitude of its charging rate (that is, the magnitude of $T_{disch}$ (fast) is greater than the magnitude of $T_{ch}$).

In situation C of FIGS. 5A and 5B, signal $V_{in}$ has disappeared so that signals $V_{out}$ and $V_{rec}$ are also absent. It can be seen that signal $V_p$ declines in amplitude with a rate corresponding to fast mode operation of peak detector 22 for the prescribed time period. Thereafter, peak detector 22 operates in slow mode so that signal $V_p$ declines in amplitude at a substantially slower rate than that for its fast mode operation. In this situation, the gain of gain-controlled amplifier 16 will increase only at the prescribed rate corresponding to slow mode operation of the feedback circuit 18.

In situation D of FIGS. 5A and 5B, signal $V_{in}$ reappears and the initial pulse of signal $V_{out}$ is amplified to amplitude peak 100 which is greater than the $V_{ref}$ level because the gain has been increased from the gain level occurring just prior to situation C. Peak detector 22 now operates in fast mode. If for the purposes of this explanation clipper circuit 36 of voltage limiter 20 was not used, initial pulse peak 102 of signal $V_{rec}$ would have a large amplitude corresponding to that for signal $V_{out}$. In such case, automatic gain control circuit 10 will respond by lowering its gain in order to reduce the amplitude of signal $V_{out}$ to the desired $V_{ref}$ level. If the amplitude difference between peak 102 and the $V_{ref}$ level causes automatic gain control circuit 10 to reduce its gain at a rate faster than the fast mode discharge rate of peak detector 22, then peak detector 22 cannot respond to the actual peaks of signal $V_{rec}$ because signal $V_{rec}$ will be reduced in amplitude faster than peak detector 22 can detect them. Consequently, signal $V_p$ substantially lags signal $V_{rec}$. When the amplitude of signal $V_p$ reaches the $V_{ref}$ level, the gain is no longer reduced. However, signal $V_{out}$ has been reduced to peak 106 (that is, undershoots the desired $V_{ref}$ level) because of the substantial lag between signal $V_p$ and $V_{rec}$. Accordingly, the gain is now increased to increase the amplitude of signal $V_{out}$. But signal $V_p$ continues to decrease because signal $V_p$ is still lagging substantially the actual value of signal $V_{rec}$. With the proper selection of the fast mode discharge rate for peak detector 22 and fast mode bandwidth for filter 24, the substantial lag between signals $V_p$ and $V_{rec}$ initially resulting from large pulse 100 of signal $V_{out}$ can be reduced so that eventually signal $V_p$ will follow $V_{rec}$ within the prescribed steady state error parameter.

However, during the transient situation described above, signal $V_{out}$ first overshoots and then undershoots the desired $V_{ref}$ level. Overshooting is undesirable because such large amplitude pulses are likely to saturate the amplifiers of subsequent data processing circuitry coupled to the output of automatic gain control circuit 10 thereby causing error in data detection. Undershooting is also undesirable because such low amplitude pulse peaks are likely to be missed by the data processing circuitry so that data is lost. The undershooting problem is precluded by the operation of voltage limiter 20. Depicted in FIGS. 6A and 6B are waveshapes useful for explaining and understanding the operation of voltage limiter 20. The parallel waveforms are not in time coincidence with one another but are in situation coincidence. Situations A and C of FIGS. 6A and 6B have been explained in the previous discussion involving FIGS. 5A and 5B. In situation D of FIGS. 6A and 6B, the magnitude of pulse peak 100 of signal $V_{out}$ overshoots the $E_{sat}$ level. Accordingly, clipper 36 operates to clip the initial pulse of signal $V_{out}$ so that voltage limiter 20 produces pulse 108 having amplitude $E_{sat}$ for signal $V_{rec}$. The amplitude of signal $V_{rec}$ will remain at the $E_{sat}$ level so long as the amplitude of signal $V_{out}$ exceeds the $E_{sat}$ level. The pulse shown with the dotted line corresponds to the pulse which would be produced if clipper 36 were not used. Since the magnitude of $E_{sat}$ is larger than that for $V_{ref}$ but smaller than the actual peak amplitude of $V_{out}$, automatic gain control circuit 10 will respond by reducing its gain in a comparatively slower rate. It should be understood that the magnitude of $E_{sat}$ can be chosen to be a level which causes automatic gain control circuit 20 to respond with a rate of gain reduction not greater than the prescribed fast mode discharge rate for peak detector 22. Therefore, the amplitude of signal $V_{out}$ is smoothly reduced to the desired $V_{ref}$ level without undershooting as was the case previously described in connection with FIG. 5.

It should be further understood that voltage limiter 20 serves to prevent signal $V_{out}$ from undershooting the desired $V_{ref}$ level but does not operate to prevent signal $V_{out}$ from substantially overshooting the desired $V_{ref}$ level. Overshooting is undesirable because of decreased reliability of detecting data, contained in signal $V_{out}$, by subsequent data processing circuitry typically coupled to the output of automatic gain control circuit 10. As further explanation, such substantial overshooting is likely to saturate some amplifiers used in the data processing circuitry thereby increasing the uncertainty in locating the pulse peaks which are representative of data contained in signal $V_{out}$. However, if signal $V_{in}$ reappears before capacitor $C_{11}$ has been substantially discharged, the gain of gain-controlled amplifier 16 will be at a level intermediate the maximum gain level so that the amplitude of the initial pulse of signal $V_{out}$, produced when signal $V_{in}$ first reappears, is likely not to be as large as the $E_{sat}$ level and the subsequent pulse peaks of signal $V_{out}$ will be reduced smoothly to the $V_{ref}$ level without resulting in output signal dropout. The dual mode peak detector is then more reliable than the voltage limiter in precluding output signal dropout without saturating some of the amplifiers of the data processing circuitry. However, in the case where signal $V_{in}$ reappears after capacitor $C_{11}$ has been substantially discharged, the slow mode feature no longer limits the gain level so that the voltage limiter is needed to preclude output signal dropout which is likely to occur if signal $V_{in}$ reappears when the gain is no longer at the intermediate gain level.

FIG. 7 is an electrical schematic of the dual mode controller circuit 84 incorporated in FIG. 1. Dual mode controller circuit 84 includes comparators 110 and 112 which are operational amplifiers that operate in known manner as comparators. Signal $V_{out}$ is applied to + input terminals 114 and 116 while threshold voltage $E_{th}$, preferably equal in magnitude to forty percent of the expected peak amplitude of signal $V_{out}$, is applied to − input terminals 118 and 120. Single shot circuit 122 and 124 are coupled to the outputs of comparators 110 and 112 respectively. OR gate 126 is coupled to the outputs of single shot circuits 122 and 124. Retriggerable single shot timer circuit 128 is coupled to the output of OR gate 126.

FIG. 8 depicts time-amplitude waveforms which are useful for explaining and understanding the operation of dual mode controller circuit 84 illustrated in FIG. 7. Plot (A) of FIG. 8 shows the single ended signals $+V_0$ and $-V_0$ contained in signal $V_{out}$. Whenever the positive amplitude of a pulse of signal $+V_0$ crosses threshold voltage level $E_{th}$, comparator 110 produces a pulse in signal $X_1$ as shown in plot (B). The leading edge of the pulse produced by comparator 110 will trigger single shot circuit 122 to produce a pulse in signal $X_2$ which is of narrow width and is shown in plot (D). Similarly, as can be determined from a consideration of plots (A), (C) and (E) a positive pulse peak of signal $-V_0$ which crosses threshold voltage level $E_{th}$ will produce a narrow pulse in signal $Y_2$. The pulse in signals $X_2$ and $Y_2$ are combined in OR gate 126 which produces signal Z shown in plot (F). The pulses in signals $X_2$ and $Y_2$ are substantially narrower than the respective pulses in signals $X_1$ and $Y_1$ in order to eliminate virtually any overlapping of pulses when they are combined in OR gate 126. The leading edge of each pulse in signal Z will cause retriggerable single shot timer 128 to produce a pulse in signal $M_c$, preferably having a fixed pulse width equal to twice $T_{max}$. Signal $M_c$ has low and high amplitudes which are used to control the operation of field effect transistors $S_1$ and $S_2$ in peak detector 22 and filter 24 respectively. When signal $M_c$ is at low level, field effect transistors $S_1$ and $S_2$ are open (nonconducting) so that peak detector 22 and filter 24 are in slow mode operation. When signal $M_c$ is at high level, field effect transistors $S_1$ and $S_2$ are closed (conducting) so that peak detector 22 and filter 24 are in fast mode operation. Threshold voltage level $E_{th}$ for dual mode control circuit 84 is preferably set at the minimum amplitude expected for a pulse which is representative of data contained in signal $V_{out}$. Therefore, so long as the peaks of signal $V_{out}$ exceed the $E_{th}$ level, dual mode control circuit 84 will produce pulses in signal $M_c$ which will maintain peak detector 22 and filter 24 in fast mode operation.

While the invention has been described with reference to a specific embodiment, it will be apparent that improvements and modifications which may be made within the purview of the invention without departing from the true spirit and scope thereof as defined in the appended claims.

I claim:

1. A dual mode automatic gain control circuit for generating control signals to a gain controlled amplifier for producing substantially constant amplitude pulse-type output data signals from said amplifier from variable amplitude pulse-type input data signals subjected to having relatively long data gaps therein, said automatic gain control circuit including:

a voltage limiter coupled to the output of the gain controlled amplifier for clipping those output data signals having amplitudes above a predetermined level and for rectifying said output signals into D.C. signals of corresponding amplitudes;

peak detector circuitry coupled to said voltage limiter, said detector circuitry including a capacitor in parallel with discharge circuitry having component values that discharge said capacitor slower than the rate said capacitor is charged by said D.C. signals;

filter circuitry coupled to said peak detector;

comparator circuitry coupled to the output of said filter circuitry for comparing the output signal from said filter circuitry with a fixed reference voltage, and for generating the control signals for said gain controlled amplifier; and mode controlling means within said automatic gain control circuit and coupled to said peak detector and to said filter circuitry, said mode controlling means responsive to the output data signals from said gain controlled amplifier for generating a first and a second mode signal to said peak detector circuitry and to said filter circuitry for altering component values in said circuitries, said first mode signal representing a fast mode for producing a control signal for a continuous train of pulse-type input data signals, said second mode signal representing a slow mode for producing control signals for gaps in said input data signals.

2. The dual mode automatic gain control circuit claimed in claim 1 wherein said mode controlling means generates said first signal in response to a continuous train of pulse-type data signals that exceed a predetermined amplitude level.

3. The dual mode automatic gain control circuit claimed in claim 2 wherein said mode controlling means includes: comparator circuitry coupled to the output of said gain controlled amplifier and to a voltage threshold source for producing output pulses in response to output data pulses that exceed the level of said threshold source; and a retriggerable timer coupled to said comparator circuitry, said timer having an output producing period at least as long as a one-half wavelength period of said output pulses and being retriggered by each output pulse from said comparator circuitry for generating said first mode signal representing said fast mode and said second mode signal representing said slow modes.

4. The dual mode automatic gain control circuit claimed in claim 1 wherein said peak detector circuitry includes first switching means coupled to said mode controlling means for altering said discharge circuit component values to increase the discharge rate of said capacitor in response to said first mode signal and to decrease the discharge rate of said capacitor in response to said second mode signal.

5. The dual mode automatic gain control circuit claimed in claim 4 wherein said peak detector circuitry discharge circuit includes a first resistor in parallel with said capacitor for providing slow discharge thereto, and wherein said first switching means includes a series connected second resistor and a first transistor switch in parallel with said first resistor, said first transistor being responsive to said first and second mode control signals for altering the total discharge resistance of said discharge circuitry.

6. The dual mode automatic gain control circuit claimed in claim 1 wherein said filter circuitry includes switching means coupled to said mode controlling means for altering component values in said filter circuitry to provide said circuitry with a fast response time and a wide bandwidth in response to said first mode signal, and to provide said filter circuitry with a slow response time and a narrow bandwidth in response to said second mode signal.

7. The dual mode automatic gain control circuit claimed in claim 6 wherein said filter circuitry includes a resistance-capacitance circuit, and wherein said switching means in said filter circuitry includes a series coupled resistance and transistor switch in parallel with the resistance in said resistance-capacitance circuit, said switch being rendered conductive and non-conductive by said first and said second mode signals, respectively.

* * * * *